US011555862B2

(12) United States Patent
Tsai et al.

(10) Patent No.: US 11,555,862 B2
(45) Date of Patent: Jan. 17, 2023

(54) GROUND FAULT DETECTION METHOD AND SYSTEM

(71) Applicants: Wanbang Digital Energy Co., LTD., Jiangsu (CN); Wanbang Star Charge Technology Ltd., Jiangsu (CN)

(72) Inventors: Hsien-Yi Tsai, Jiangsu (CN); Daquan Xie, Jiangsu (CN); Fei Du, Jiangsu (CN); Rupei Zhang, Jiangsu (CN)

(73) Assignees: Wanbang Digital Energy Co., LTD., Jiangsu (NO); Wanbang Star Charge Technology LTD., Jiangsu (CN)

( * ) Notice: Subject to any disclaimer, the term of this patent is extended or adjusted under 35 U.S.C. 154(b) by 242 days.

(21) Appl. No.: 17/035,726

(22) Filed: Sep. 29, 2020

(65) Prior Publication Data

US 2021/0096191 A1    Apr. 1, 2021

(30) Foreign Application Priority Data

Sep. 30, 2019   (CN) .......................... 2019109394209

(51) Int. Cl.
*G01R 31/52* (2020.01)
*B60L 53/60* (2019.01)

(52) U.S. Cl.
CPC .............. *G01R 31/52* (2020.01); *B60L 53/60* (2019.02)

(58) Field of Classification Search
CPC ........ G01R 31/52; G01R 27/18; G01R 31/54; G01R 31/55; B60L 53/60
See application file for complete search history.

(56) References Cited

U.S. PATENT DOCUMENTS

2016/0274166 A1 * 9/2016 Seff ......................... G01R 31/52
2019/0160947 A1 * 5/2019 Tsai ....................... B60L 3/0046

FOREIGN PATENT DOCUMENTS

| CN | 205681098 U | * | 8/2016 | ............... H02H 3/32 |
| JP | 3781289 B2 | * | 5/2006 | ............... B60L 3/00 |
| JP | WO2017159053 A1 | * | 9/2017 | ............... B60L 3/00 |

* cited by examiner

*Primary Examiner* — Alvaro E Fortich
*Assistant Examiner* — Dilara Sultana

(57) ABSTRACT

The present disclosure provides a method and system for ground fault detection. The method may include obtaining an input voltage and a null-ground voltage; determining whether the null-ground voltage is less than a voltage threshold; if yes, further determining whether the null-ground voltage is less than a preset voltage; if yes, determining that the grounding state is normal; if the null-ground voltage is greater than or equal to the preset voltage, determining that the grounding state is abnormal; if the null-ground voltage is greater than or equal to the voltage threshold, determining that the live wire and the null wire are reversed; in the case that the live wire and the null wire are reversed, determining whether the difference between the input voltage and the null-ground voltage is less than the preset voltage; if yes, determining that the grounding state is normal; if no, determining that the grounding state is abnormal.

8 Claims, 4 Drawing Sheets

GROUND FAULT DETECTION METHOD AND SYSTEM

CROSS REFERENCE TO RELATED APPLICATION

This application claims priority to Chinese Application No. 201910939420.9, filed on Sep. 30, 2019, the entire contents of which are hereby incorporated by reference.

TECHNICAL FIELD

The present disclosure generally relates to circuit detection, and more specifically, relates to a ground fault detection method and a ground fault detection system.

BACKGROUND

With the development of science and technology, new energy vehicles have stepped into people's lives. The rapid development of new energy vehicles drives the development of charging equipment (e.g., a charging pile, a charging gun, a distribution cabinet, etc.). To ensure that users may safely charge products in large charging places or charging stations, charging piles must be well grounded. If a charging pile is poorly grounded, the high internal voltage of the charging pile will threaten the safety of users.

The traditional ground detection circuit uses Y-capacitor charging current detection, collocated with an optical coupler. The Y-capacitor charging current detection may be easily affected by the input voltage bias, the external live wire impedance, or the null wire impedance, which may result in the failure of the ground detection circuit. The use of an optical coupler may easily lead to the malfunction of the ground detection circuit due to the high temperature attenuation of the current transfer ratio (CTR) value of the optical coupler. In addition, the traditional ground detection circuit cannot determine whether the live wire and the null wire are reversed. In the reversed state, the traditional ground detection circuit cannot detect whether it is well grounded.

SUMMARY

In a first aspect of the present disclosure, a method for ground fault detection is provided. The method may be implemented on a computing device having at least one processor and a non-transitory storage medium. The method may include: obtaining an input voltage by detecting a voltage between a live wire and a null wire, and a null-ground voltage by detecting a voltage between the null wire and a ground wire, respectively; determining whether the null-ground voltage is less than a voltage threshold; if the null-ground voltage is less than the voltage threshold, determining whether the null-ground voltage is less than a preset voltage; if the null-ground voltage is less than the preset voltage, determining that a grounding state is normal; if the null-ground voltage is greater than or equal to the preset voltage, determining that the grounding state is abnormal; and if the null-ground voltage is greater than or equal to the voltage threshold, determining that the live wire and the null wire are reversed.

In some embodiments, the method may further include: in a case that the live wire and the null wire are reversed, determining whether a difference between the input voltage and the null-ground voltage is less than the preset voltage; if the difference between the input voltage and the null-ground voltage is less than the preset voltage, determining that the grounding state is normal; and if the difference between the input voltage and the null-ground voltage is greater than or equal to the preset voltage, determining that the grounding state is abnormal.

In some embodiments, the input voltage may be obtained by detecting the voltage between the live wire and the null wire via an isolation voltage detection circuit.

In some embodiments, the null-ground voltage may be obtained by detecting the voltage between the null wire and the ground wire via a differential voltage detection circuit.

In a second aspect of the present disclosure, a system for ground fault detection is provided. The system may include at least one storage medium including a set of instructions, and at least one processor in communication with the at least one storage medium. When executing the set of instructions, the at least one processor may be configured to direct the system to: obtain an input voltage by detecting a voltage between a live wire and a null wire, and a null-ground voltage by detecting a voltage between the null wire and a ground wire, respectively; determine whether the null-ground voltage is less than a voltage threshold; if the null-ground voltage is less than the voltage threshold, determine whether the null-ground voltage is less than a preset voltage; if the null-ground voltage is less than the preset voltage, determine that a grounding state is normal; if the null-ground voltage is greater than or equal to the preset voltage, determine that the grounding state is abnormal; and if the null-ground voltage is greater than or equal to the voltage threshold, determine that the live wire and the null wire are reversed.

In some embodiments, the at least one processor may be further configured to direct the system to: in a case that the live wire and the null wire are reversed, determine whether a difference between the input voltage and the null-ground voltage is less than the preset voltage; if the difference between the input voltage and the null-ground voltage is less than the preset voltage, determine that the grounding state is normal; and if the difference between the input voltage and the null-ground voltage is greater than or equal to the preset voltage, determine that the grounding state is abnormal.

In some embodiments, the input voltage may be obtained by detecting the voltage between the live wire and the null wire via an isolation voltage detection circuit.

In some embodiments, the null-ground voltage may be obtained by detecting the voltage between the null wire and the ground wire via a differential voltage detection circuit.

In some embodiments, the isolation voltage detection circuit may include a voltage transformer. One terminal of an input side of the voltage transformer may connect to a live wire terminal through a first resistor, and the other terminal of the input side of the voltage transformer may connect to a null wire terminal. Two terminals of an output side of the voltage transformer may respectively connect with two detection signal output terminals of the isolation voltage detection circuit through a second resistor and a third resistor. A fourth resistor, a first diode and a second diode may parallelly connect with the two terminals of the output side of the voltage transformer, while the first diode and the second diode are inverted in parallel. The two detection signal output terminals of the isolation voltage detection circuit may be respectively grounded through a first capacitor and a second capacitor.

In some embodiments, the differential voltage detection circuit may include a differential amplifier. Two input terminals of the differential amplifier may respectively connect to a null wire terminal and a ground wire terminal. An output terminal of the differential amplifier may serve as a detection signal output terminal of the differential voltage detection circuit.

In a third aspect of the present disclosure, a non-transitory computer readable medium may store instructions, the instructions, when executed by at least one processor, the at least one processor may be configured to perform one or more of the following operations. An input voltage may be obtained by detecting a voltage between a live wire and a null wire, and a null-ground voltage may be obtained by detecting a voltage between the null wire and a ground wire. Whether the null-ground voltage is less than a voltage threshold may be determined. If the null-ground voltage is less than the voltage threshold, whether the null-ground voltage is less than a preset voltage may be determined. If the null-ground voltage is less than the preset voltage, that a grounding state is normal may be determined. If the null-ground voltage is greater than or equal to the preset voltage, that the grounding state is abnormal may be determined. If the null-ground voltage is greater than or equal to the voltage threshold, that the live wire and the null wire are reversed may be determined.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of example embodiments. These example embodiments are described in detail with reference to the drawings. The drawings are not to scale. These embodiments are non-limiting example embodiments, in which like reference numerals represent similar structures throughout the several views of the drawings, and wherein.

DETAILED DESCRIPTION OF THE PREFERRED EMBODIMENTS

Figure 1:
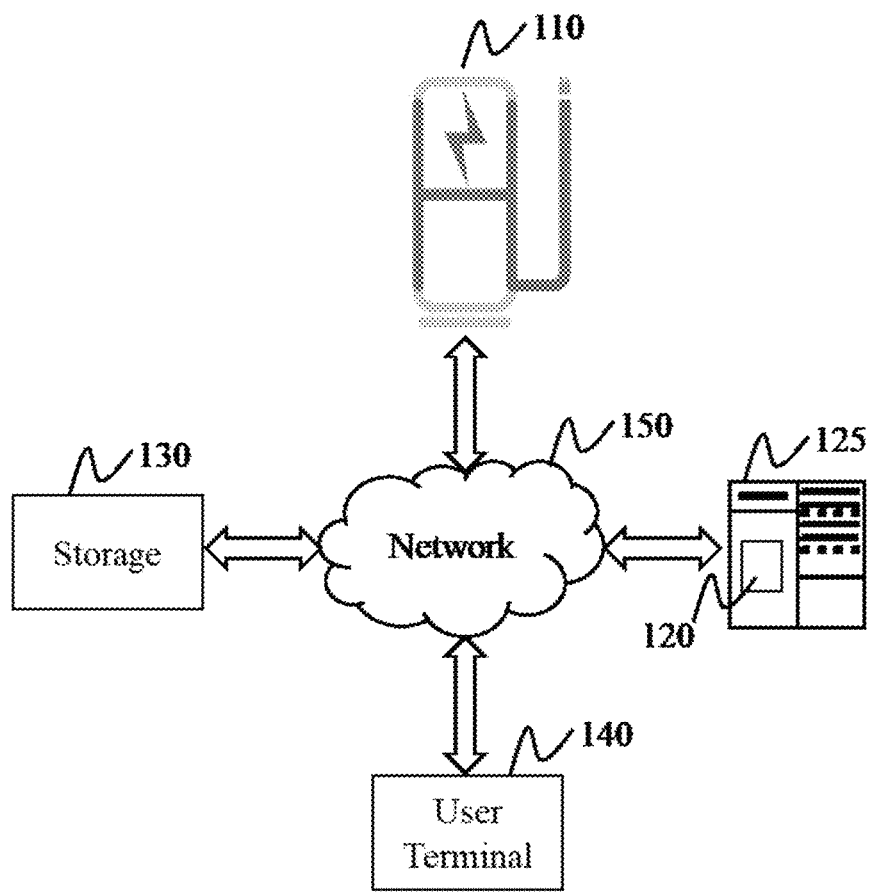
FIG. 1 is a block diagram illustrating an example ground fault detection system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, module, systems, devices, and/or drivers have been described at a relatively high-level, without detail, in order to avoid unnecessarily obscuring aspects of the present disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "module," "unit," and/or "circuit" used herein are one method to distinguish different components, elements, parts, section or assembly of different level in ascending order. However, the terms may be displaced by other expression if they achieve the same purpose.

It will be understood that when a device, unit, or module is referred to as being "on," "connected to," or "coupled to" another device, unit, or module, it may be directly on, connected or coupled to, or communicate with the other device, unit, or module, or an intervening device, unit, or module may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

For illustration purposes, the disclosure describes systems and methods for ground fault detection. The system may be configured to obtain an input voltage by detecting a voltage between a live wire and a null wire, and a null-ground voltage by detecting a voltage between the null wire and a ground wire, respectively. The system may be configured to determine whether the null-ground voltage is less than a voltage threshold. If the null-ground voltage is less than the voltage threshold, the system may be further configured to determine whether the null-ground voltage is less than a preset voltage. If the null-ground voltage is less than the preset voltage, the system may determine that a grounding state is normal. If the null-ground voltage is greater than or equal to the preset voltage, the system may determine that the grounding state is abnormal. If the null-ground voltage is greater than or equal to the voltage threshold, the system may determine that the live wire and the null wire are reversed. For persons having ordinary skills in the art, multiple variations or modifications may be made under the teachings of the present disclosure.

FIG. 1 is a block diagram illustrating an example ground fault detection system according to some embodiments of the present disclosure. In some embodiments, the ground fault detection system 100 may be used in a power transmission system. For example, when the power transmission system transmits electric energy from a power supply (e.g., power grid) to a load (e.g., electric vehicle) through a transmitter (e.g., a charging pile), the ground fault detection system 100 may be used to detect a grounding state of the transmitter. The electric energy transmission from the power supply to the load through the transmitter may be wirely or wirelessly. The electric energy transmission may be in the form of alternating current or direct current. As used herein, the "grounding state" may include grounding normally, grounding abnormally, or a live wire and a null wire are reversed, etc. In some embodiments, the ground fault detection system 100 may be used in any other suitable system, including but not limited to an air conditioning system, a vehicle electrical system, a power distribution system, etc.

As illustrated in FIG. 1, the ground fault detection system 100 may include a charging device 110, a server 125, a storage 130, a user terminal 140, and a network 150.

The charging device 110 may be configured to provide electric energy to electrical vehicles based on a power supply. The charging device 110 may provide electric energy in the form of alternating current or direct current. The charging device 110 may provide electric energy in a wire manner or a wireless manner. In the wire manner, the charging device 110 may provide electric energy to electrical vehicles through a charging connector (e.g., a charging gun). In the wireless manner, the charging device 110 may provide electric energy to electrical vehicles using the electromagnetic induction technology. In some embodiments, the charging device 110 may include various circuits for obtaining parameters/data that the ground fault detection system 100 needs to implement the ground fault detection. For example, a voltage between a live wire and a null wire connected to the charging device 110, a voltage between the null wire and a ground wire connected to the charging device 110, etc.

The server 125 may be configured to receive information and/or data related to the ground fault detection system 100. For example, the server 125 may process voltage/current data of the charging device 110 to detect the grounding state of the charging device 110. The server 125 may acquire the voltage/current data of the charging device 110 in real time or in a fixed time interval. In some embodiments, the charging device 110 may send the voltage/current data to the server 125 in real time or in a fixed time interval. The server 125 may be a single server or a server group. The server group may be centralized, or distributed (e.g., the server 125 may be a distributed system). In some embodiments, the server 125 may be local or remote. For example, the server 125 may access information and/or data stored in the charging device 110, and/or the storage 130 via the network 150. As another example, the server 125 may be directly connected to the charging device 110 and/or the storage 130 to access stored information and/or data. In some embodiments, the server 125 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the server 125 (or a portion thereof) may be implemented on a computing device 200 having one or more components illustrated in FIG. 2 of the present disclosure.

In some embodiments, the server 125 may include a processing device 120. According to some embodiments of the present disclosure, the processing device 120 may process information and/or data related to the ground fault detection system 100 to perform one or more functions described in the present disclosure. For example, the processing device 120 may acquire voltage/current data of the charging device 110 from the one or more components of the ground fault detection system 100, such as the storage 130 via the network 150. The processing device 120 may further detect the grounding state of the charging device 110 by analyzing the voltage/current data.

In some embodiments, the processing device 120 may include one or more processors (e.g., single-core processor(s) or multi-core processor(s)) to perform operations disclosed in this disclosure. The processor(s) may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof. For example, the processing device 120 may include a microprocessor to process voltage/current data of the charging device 110.

The storage 130 may be configured to store data and/or instructions related to the ground fault detection system 100. In some embodiments, the data and/or instructions may be obtained from, for example, the charging device 110, the processing device 120, the user terminal 140, and/or other component(s) of the ground fault detection 100. In some embodiments, the storage 130 may include a mass storage device, a removable storage device, a volatile read-and-write memory, a read-only memory (ROM), or the like, or any combination thereof. For example, the mass storage device may include a magnetic disk, an optical disk, a solid-state driver, etc. The removable storage device may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, storage 130 may be configured to store one or more programs and/or instructions that may be executed by the server 125 of the ground fault detection 100 to perform example methods described in this disclosure. For example, the storage 130 may be configured to store program(s) and/or instruction(s) executed by the server 125 to detect the grounding state of the charging device 110.

In some embodiments, the storage 130 may be connected to the network 150 to communicate with one or more components of the ground fault detection 100 (e.g., the server 125, the charging device 110, etc.). One or more components of the ground fault detection 100 may access the data or instructions stored in the storage 130 via the network 150. In some embodiments, the storage 130 may be directly connected to or communicate with one or more components of the ground fault detection 100 (e.g., the server 125, the charging device 110, etc.). In some embodiments, the storage 130 may be part of the server 125 or the charging device 110. In some embodiments, one or more components of the ground fault detection 100 (e.g., the server 125, the charging device 110, etc.) may have a permission to access the storage 130. In some embodiments, one or more components of the ground fault detection 100 may read and/or modify information stored in the storage 130 when one or more conditions are met.

The user terminal 140 may be configured to enable a user interaction between a user and the ground fault detection system 100. For example, the user terminal 140 may receive a ground fault detection result from the processing device 120 and display the ground fault detection result to a user. In some embodiments, the user terminal 140 may include a smart phone, a personal computer, a tablet, a laptop, a wearable device (e.g., a smart watch, a pair of smart glasses, or the like), or the like, or a combination thereof. In some embodiments, the user terminal 140 and the processing device 120 may be integrated in one device configured to perform example functions of the user terminal 140 and the processing device 120 disclosed in this disclosure.

The network 150 may be configured to facilitate communications among the components of the ground fault detection system 100. In some embodiments, one or more components in the ground fault detection system 100 (e.g., the server 125, the charging device 110, and the storage 130) may send information and/or data to another component(s) in the ground fault detection system 100 via the network 150. For example, the charging device 110 may transmit charging data (e.g., voltage, current, temperature, humidity, etc.) to the processing device 120 via the network 150. As another example, the processing device 120 may transmit a processing result to the user terminal 140 via the network 150.

In some embodiments, the network 150 may be any type of wired or wireless network, or combination thereof. For example, the network 150 may include a wired network, a wireless network, or any connection capable of transmitting and receiving data. In some embodiments, the wired network may include a connection using a metal cable, an optical cable, a hybrid cable, or the like, or any combination thereof. In some embodiments, the wireless network may include a near field communication (NFC), a body area network (BAN), a personal area network (PAN, e.g., a Bluetooth, a Z-Wave, a Zigbee, a wireless USB), a near-me area network (NAN), a local wireless network, a backbone network, a metropolitan area network (MAN), a wide area network (WAN), an internet area network (IAN, or cloud), or the like, or any combination thereof. In some embodiments, the charging device 110, the processing device 120, the storage 130, the user terminal 140, and/or the network 150 may be connected to or communicate with each other directly or indirectly.

It should be noted that the above description of the ground fault detection system 100 is merely provided for the purposes of illustration and not intended to limit the scope of the present disclosure. For persons having ordinary skills in the art, multiple variations or modifications may be made under the teachings of the present disclosure. However, those variations and modifications do not depart from the scope of the present disclosure. For example, the ground fault detection system 100 may include one or more additional components not mentioned above, and/or one or more components mentioned above may be omitted. For example, two or more of the components of the ground fault detection system 100 may be integrated into a single device. For example, the processing device 120 and/or the storage 130 may be integrated into the charging device 110. In some embodiments, the components of the ground fault detection system 100 may be located remotely from each other.

Figure 2:
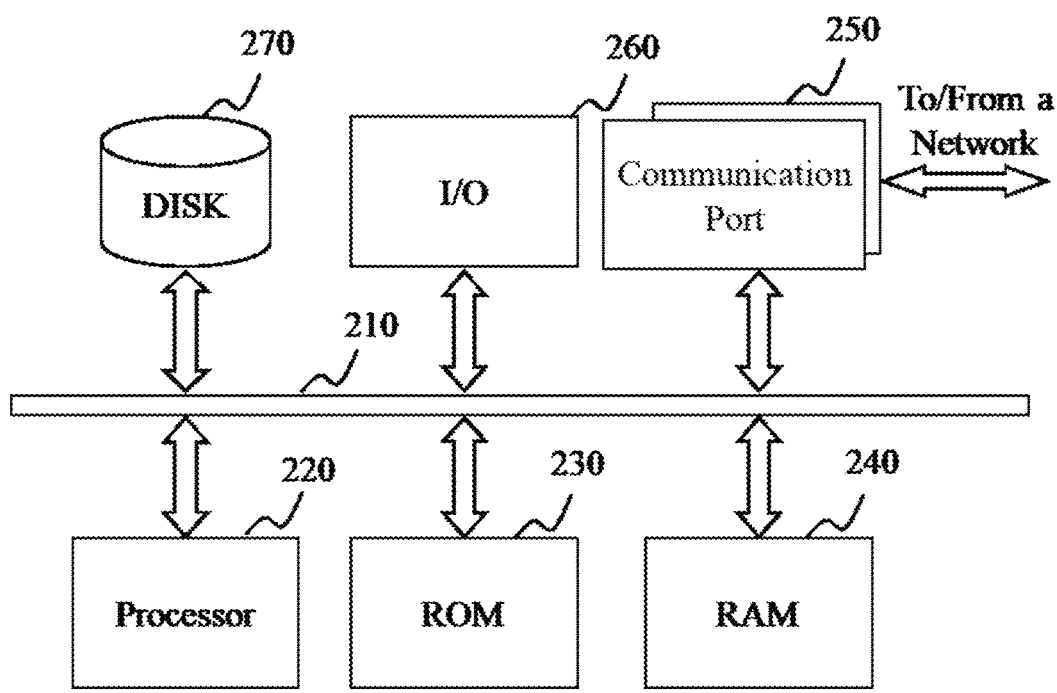
FIG. 2 is a schematic diagram illustrating example hardware and software components of a computing device according to some embodiments of the present disclosure.

FIG. 2 is a schematic diagram illustrating example hardware and software components of a computing device 200 according to some embodiments of the present disclosure.

The computing device 200 may be a general purpose computer or a special purpose computer. Both may be used to implement the ground fault detection system 100 of the present disclosure. The computing device 200 may be used to implement any component of the ground fault detection system 100 as described herein. For example, the processing device 120 of the ground fault detection system 100 and/or the user terminal 140 may be implemented on the computing device 200, via its hardware, software program, firmware, or a combination thereof. Although only one such computer is shown for convenience, the computer functions related to the ground fault detection system 100 as described herein may be implemented in a distributed manner on a number of similar platforms to distribute the processing load.

The computing device 200, for example, may include a communication port 250 connected to a network (e.g., the network 150) to facilitate data communications. The computing device 200 may also include a processor 220, in the form of one or more processors, for executing program instructions. In some embodiments, the processor 220 may include interface circuits and processing circuits therein. The interface circuits may be configured to receive electronic signals from the communication port 250, wherein the electronic signals encode structured data and/or instructions for the processing circuits to process. The processing circuits may conduct logic calculations, and then determine a conclusion, a result, and/or an instruction encoded as electronic signals. Then the interface circuits may send out the electronic signals from the processing circuits via the communication port 250.

The computing device 200 may further include an internal communication bus 210, program storage and data storage of different forms, for example, a disk 270, and a read only memory (ROM) 230, or a random access memory (RAM) 240, for various data files to be processed and/or transmitted. The computing device 200 may also include program instructions stored in the ROM 230, the RAM 240, and/or other type of non-transitory storage medium to be executed by the processor 220. The methods and/or processes of the present disclosure may be implemented as the program instructions. The computing device 200 also includes an I/O 260, supporting input/output between the computer and other components therein. The computing device 200 may also receive programming and data via network communications.

Merely for illustration, only one processor is described in the computing device 200. However, it should be noted that the computing device 200 in the present disclosure may also include multiple processors, thus operations and/or method steps that are performed by one processor as described in the present disclosure may also be jointly or separately performed by the multiple processors. For example, the processor of the computing device 200 executes both operation A and operation B. As in another example, operation A and operation B may also be performed by two different processors in the computing device 200 jointly or separately (e.g., the first processor executes operation A, and the second processor executes operation B; or the first and second processor jointly execute operations A and B).

Figure 3:
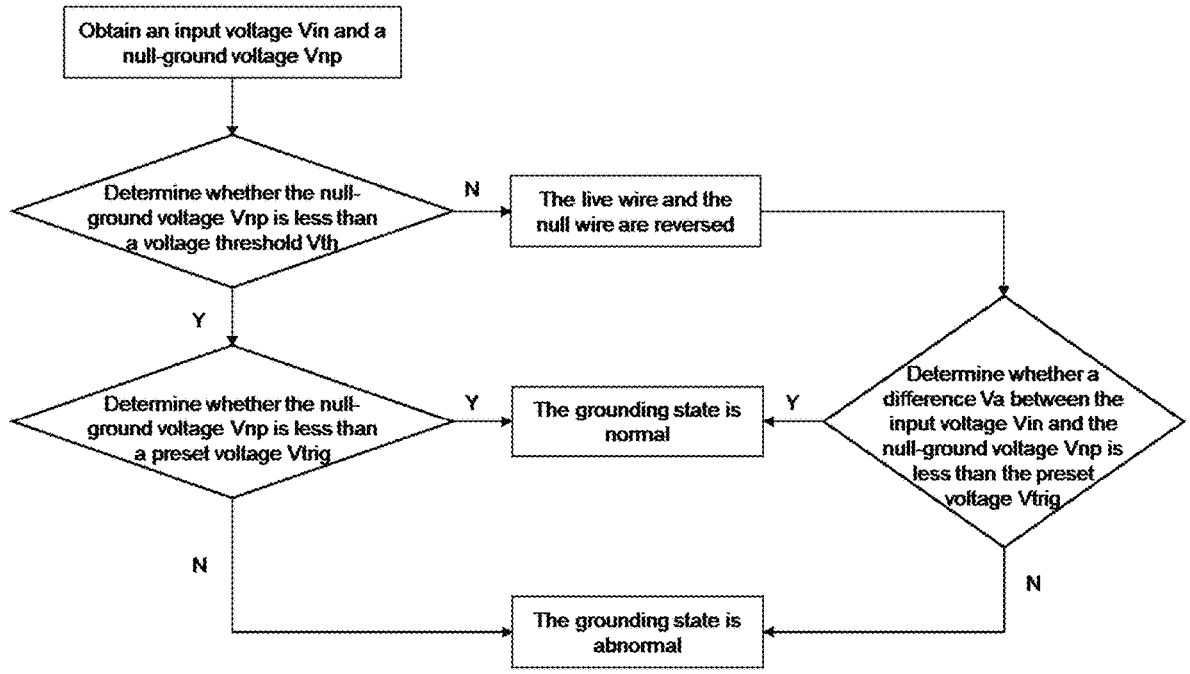
FIG. 3 is a flowchart illustrating an example process for ground fault detection according to some embodiments of the present disclosure.
Figure 4:
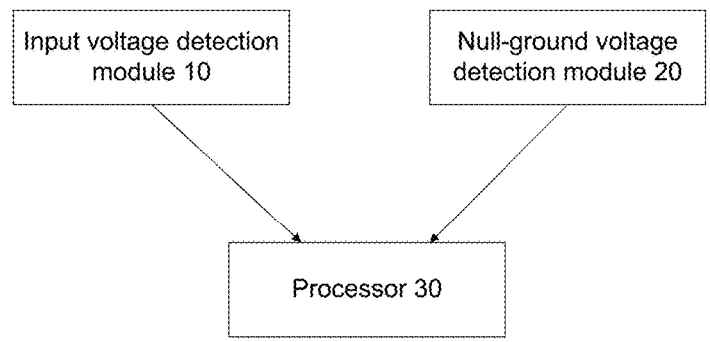
FIG. 4 is a block diagram illustrating an example processing device according to some embodiments of the present disclosure.

FIG. 3 is a flowchart illustrating an example process 300 for ground fault detection according to some embodiments of the present disclosure. In some embodiments, at least part of the process 300 may be performed by the ground fault detection system 100. For example, the process 300 may be stored in a storage device (e.g., the storage 130, etc.) in the form of instructions (e.g., an application), and invoked and/or executed by the processing device 120 (e.g., the processor 220 of the computing device 200 as illustrated in FIG. 2, and/or one or more modules as illustrated in FIG. 4).

The processing device 120 (e.g., an input voltage detection module, a null-ground voltage detection module) may obtain an input voltage Vin and a null-ground voltage Vnp of the charging device 110. The input voltage Vin may be determined by detecting a voltage between the live wire and the null wire. The null-ground voltage Vnp may be determined by detecting a voltage between the null wire and the ground wire. In some embodiments, the input voltage Vin may be determined through an isolation voltage detection circuit within the input voltage detection module, and the null-ground voltage Vnp may be determined through a differential voltage detection circuit within the null-ground voltage detection module, detailed descriptions may be found in FIG. 5 and FIG. 6, and related descriptions thereof.

The processing device 120 may determine whether the null-ground voltage Vnp is less than a voltage threshold Vth. In response to a determination that the null-ground voltage Vnp is less than the voltage threshold Vth, the processing device 120 may further determine whether the null-ground voltage Vnp is less than a preset voltage Vtrig. If the null-ground voltage Vnp is less than the preset voltage Vtrig, the grounding state may be normal. If the null-ground voltage Vnp is greater than or equal to the preset voltage Vtrig, the grounding state may be abnormal.

If the null-ground voltage Vnp is greater than or equal to the voltage threshold Vth, the live wire and the null wire may be reversed. In the case that the live wire and the null wire are reversed, the processing device 120 may further determine whether a difference Va between the input voltage Vin and the null-ground voltage Vnp is less than the preset voltage Vtrig. If the difference Va between the input voltage Vin and the null-ground voltage Vnp is less than the preset voltage Vtrig, the grounding state may be normal. If the difference Va between the input voltage Vin and the null-ground voltage Vnp is greater than or equal to the preset voltage Vtrig, the grounding state may be abnormal.

In some embodiments, a value range of the voltage threshold Vth may be (0, Vin). Preferably, the voltage threshold Vth may be ½ Vin.

In some embodiments, the preset voltage Vtrig may be set according to the ground impedance condition. A value range of the preset voltage Vtrig may be (0, Vth). Preferably, the preset voltage Vtrig may be ⅔ Vth.

In some embodiments, the processing device 120 may send an alarm signal to the charging device 110 when the grounding state is abnormal or the live wire and the null wire are reversed. In some embodiments, alarm signals corresponding to different grounding states may be preset and stored in the storage 130. For example, the processing device 120 may send an alarm signal to control an alertor of the charging device 110 to produce alarm voices or emit alarm lights when the grounding state is abnormal or the live wire and the null wire are reversed. In some embodiments, the processing device 120 may send an alarm signal to the user terminal 140 when the grounding state is abnormal or the live wire and the null wire are reversed. Then, the user terminal 140 may display the information that the grounding state is abnormal or the live wire and the null wire are reversed.

According to the ground fault detection method of the present disclosure, the input voltage and the null-ground voltage may be obtained by respectively detecting the voltage between the live wire and the null wire, and the voltage between the null wire and the ground wire. Then, according to a magnitude relationship between the null-ground voltage and the voltage threshold, whether the live wire and the null wire are reversed may be determined. If the live wire and the null wire are not reversed, whether the grounding state is abnormal may be determined according to a magnitude relationship between the null-ground voltage and the preset voltage. If the live wire and the null wire are reversed, whether the grounding state is abnormal may be determined according to a magnitude relationship between a difference of the input voltage and the null-ground voltage and the preset voltage. Therefore, the ground fault detection method of the present disclosure may accurately determine whether the charging device 110 is grounded abnormally and whether the live and null wires are reversed. The ground fault detection method of the present disclosure may detect, in the case that the live and null wires are reversed, whether the charging device 110 is grounded abnormally, and may improve the shortcomings of traditional ground detection circuits that are susceptible to temperature. Circuits used in the present disclosure may have simple structures, fewer parts, and lower costs.

FIG. 4 is a block diagram illustrating an example processing device 120 according to some embodiments of the present disclosure. The processing device 120 may include an input voltage detection module 10, a null-ground voltage detection module 20, and a processor 30. The input voltage detection module 10 may detect a voltage between a live wire and a null wire to obtain an input voltage Vin. The null-ground voltage detection module 20 may detect a voltage between the null wire and a ground wire to obtain a null-ground voltage Vnp. The processor 30 may connect with the input voltage detection module 10 and the null-ground voltage detection module 20, respectively. The processor 30 may determine whether the null-ground voltage Vnp is less than a voltage threshold Vth. In response to a determination that the null-ground voltage Vnp is less than the voltage threshold Vth, the processor 30 may further determine whether the null-ground voltage Vnp is less than a preset voltage Vtrig. If the null-ground voltage Vnp is less than the preset voltage Vtrig, the processor 30 may determine that the grounding state is normal. If the null-ground voltage Vnp is greater than or equal to the preset voltage Vtrig, the processor 30 may determine that the grounding state is abnormal. If the null-ground voltage Vnp is greater than or equal to the voltage threshold Vth, the processor 30 may determine that the live wire and the null wire are reversed. In the case that the live wire and the null wire are reversed, the processor 30 may further determine whether a difference Va between the input voltage Vin and the null-ground voltage Vnp is less than the preset voltage Vtrig. If the difference Va between the input voltage Vin and the null-ground voltage Vnp is less than the preset voltage Vtrig, the processor 30 may determine that the grounding state is normal. If the difference Va between the input voltage Vin and the null-ground voltage Vnp is greater than or equal to the preset voltage Vtrig, the processor 30 may determine that the grounding state is abnormal.

In some embodiments, a value range of the voltage threshold Vth may be (0, Vin). Preferably, the voltage threshold Vth may be ½ Vin.

In some embodiments, the preset voltage Vtrig may be set according to the ground impedance condition. A value range of the preset voltage Vtrig may be (0, Vth). Preferably, the preset voltage Vtrig may be ⅔ Vth.

Figure 5:
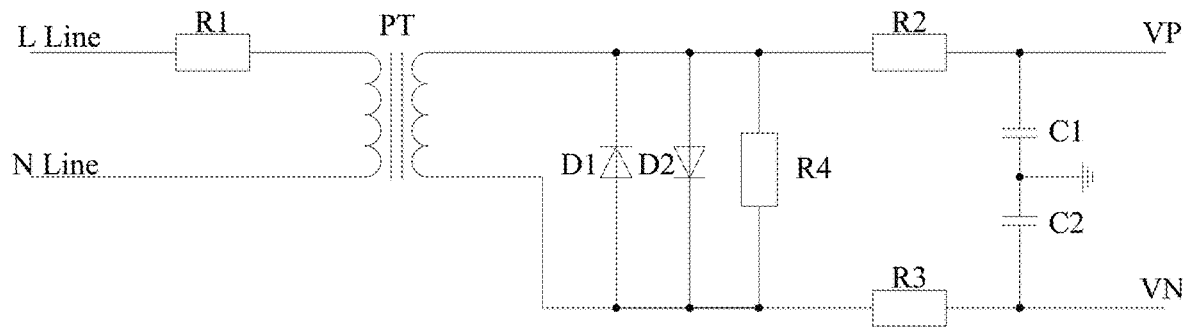
FIG. 5 is a circuit diagram illustrating an isolation voltage detection circuit according to some embodiments of the present disclosure.

FIG. 5 is a circuit diagram illustrating an isolation voltage detection circuit according to some embodiments of the present disclosure. In some embodiments, the isolation voltage detection circuit may be set in the input voltage detection module 10 as illustrated in FIG. 4. As shown in the figure, the isolation voltage detection circuit may include a voltage transformer PT. One terminal of the input side of the voltage transformer PT may connect to the live wire terminal through a first resistor R1, and the other terminal of the input side of the voltage transformer PT may connect to the null wire terminal. Two terminals of the output side of the voltage transformer PT may respectively connect with two detection signal output terminals VP and VN of the isolation voltage detection circuit through a second resistor R2 and a third resistor R3. A fourth resistor R4, a first diode D1 and a second diode D2 may parallelly connect with the two terminals of the output side of the voltage transformer PT. The first diode D1 and the second diode D2 may be inverted in parallel. The two detection signal output terminals VP and VN of the isolation voltage detection circuit may be respectively grounded through a first capacitor C1 and a second capacitor C2.

Figure 6:
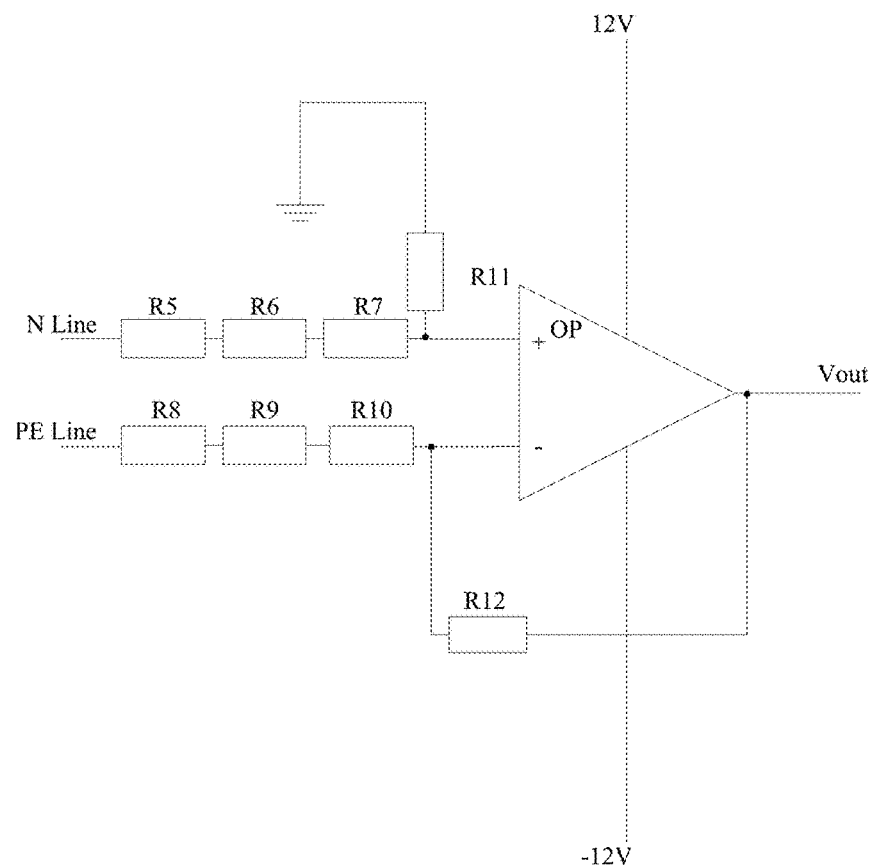
FIG. 6 is a circuit diagram illustrating a differential voltage detection circuit according to some embodiments of the present disclosure.

FIG. 6 is a circuit diagram illustrating a differential voltage detection circuit according to some embodiments of the present disclosure. In some embodiments, the differential voltage detection circuit may be set in the null-ground voltage detection module 20 as illustrated in FIG. 4. As shown in the figure, the differential voltage detection circuit may include a differential amplifier. Two input terminals of the differential amplifier may be respectively connected to the null wire terminal and the ground wire terminal. The output terminal of the differential amplifier may serve as a detection signal output terminal of the differential voltage detection circuit. Specifically, the differential amplifier may include an operational amplifier OP. The non-inverting input terminal of the operational amplifier OP may connect to the null fire terminal through a first resistor branch (including R5, R6, R7). The inverting input terminal of the operational amplifier OP may connect to the ground wire terminal through a second resistor branch (including R8, R9, R10). The non-inverting input terminal of the operational amplifier OP may be grounded through a fifth resistor R11. A sixth resistor R12 may be connected between the inverting input terminal and the output terminal of the operational amplifier OP. The output terminal of the operational amplifier OP may serve as the detection signal output terminal Vout of the differential voltage detection circuit. Two power supply terminals of the operational amplifier OP may respectively connect to a 12V positive power supply and a 12V negative power supply. In some embodiments, the output terminal of the operational amplifier OP may connect with a TVS tube for circuit protection and an RC filter circuit for output signal filtering. The sixth resistor R12 may be connected in parallel with a capacitor. The non-inverting input terminal and the two power supply terminals of the operational amplifier OP may be grounded through capacitors respectively to filter out AC signals. In some embodiments, a voltage follower circuit may be provided at the subsequent stage of the differential voltage detection circuit.

In some embodiments, the voltage transformer PT may be HPT205A transformer.

In some embodiments, the processor 30 may send an alarm signal after determining that the grounding state is abnormal or the live wire and the null wire are reversed. In some embodiments, alarm signals corresponding to different grounding states may be preset and stored in the storage 130. For example, the processor 30 may send an alarm signal to control an alertor of the charging device 110 to produce alarm voices or emit alarm lights when the grounding state is abnormal or the live wire and the null wire are reversed. In some embodiments, the processor 30 may send an alarm signal to the user terminal 140 when the grounding state is abnormal or the live wire and the null wire are reversed. Then, the user terminal 140 may display the information that the grounding state is abnormal or the live wire and the null wire are reversed.

According to some embodiments of the present disclosure, the input voltage may be obtained by the input voltage detection module, and the null-ground voltage may be obtained by the null-ground voltage detection module. The processor may then determine whether the live wire and the null wire are reversed according to a magnitude relationship between the null-ground voltage and the voltage threshold. If the live wire and the null wire are not reversed, whether the grounding state is abnormal may be determined according to a magnitude relationship between the null-ground voltage and the preset voltage. If the live wire and the null wire are reversed, whether the grounding state is abnormal may be determined according to a magnitude relationship between a difference of the input voltage and the null-ground voltage and the preset voltage. Therefore, the ground fault detection method of the present disclosure may accurately determine whether the charging device 110 is grounded abnormally and whether the live and null wires are reversed. The ground fault detection method of the present disclosure may detect, in the case that the live and null wires are reversed, whether the charging device 110 is grounded abnormally, and may improve the shortcomings of traditional ground detection circuits that are susceptible to temperature. Circuits used in the present disclosure may have simple structures, fewer parts, and lower costs.

In the description of the present disclosure, the terms "first" and "second" are only for descriptive purposes, and cannot be understood as indicating or implying relative importance or implicitly indicating the number of indicated technical features. Thus, the features defined with "first" and "second" may explicitly or implicitly include one or more of these features. The meaning of "one or more" means one or more than one, unless otherwise specifically defined.

In the present disclosure, unless otherwise clearly specified and limited, the terms "install", "connect", "couple", "fix" and other terms should be understood in a broad sense. For example, the connection may include a fixed connection, a detachable connection, or an integration. The connection may be a mechanical connection or an electrical connection. The connection may be a direct connection, or an indirect connection through an intermediate medium. The connection may also be an internal connection between two components or interaction between two components. For those skilled in the art, the specific meanings of the above terms in specific situations of the present disclosure is apparent.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A method for ground fault detection implemented on a computing device having at least one processor and a non-transitory storage medium, the method comprising:
   obtaining an input voltage by detecting a voltage between a live wire and a null wire, and a null-ground voltage by detecting a voltage between the null wire and a ground wire, respectively; wherein the input voltage is obtained by detecting the voltage between the live wire and the null wire via an isolation voltage detection circuit;
   determining whether the null-ground voltage is less than a voltage threshold;
   if the null-ground voltage is less than the voltage threshold, determining whether the null-ground voltage is less than a preset voltage;
   if the null-ground voltage is less than the preset voltage, determining that a grounding state is normal;
   if the null-ground voltage is greater than or equal to the preset voltage, determining that the grounding state is abnormal; and
   if the null-ground voltage is greater than or equal to the voltage threshold, determining that the live wire and the null wire are reversed;
   wherein the isolation voltage detection circuit includes a voltage transformer, one terminal of an input side of the voltage transformer connects to a live wire terminal through a first resistor, and the other terminal of the input side of the voltage transformer connect to a null wire terminal; two terminals of an output side of the voltage transformer respectively connects with two detection signal output terminals of the isolation voltage detection circuit through a second resistor and a third resistor, and a fourth resistor, a first diode and a second diode parallelly connect with the two terminals of the output side of the voltage transformer, while the first diode and the second diode are inverted in parallel; and the two detection signal output terminals of the isolation voltage detection circuit are respectively grounded through a first capacitor and a second capacitor.

2. The method of claim 1, further comprising:
   in a case that the live wire and the null wire are reversed, determining whether a difference between the input voltage and the null-ground voltage is less than the preset voltage;
   if the difference between the input voltage and the null-ground voltage is less than the preset voltage, determining that the grounding state is normal; and
   if the difference between the input voltage and the null-ground voltage is greater than or equal to the preset voltage, determining that the grounding state is abnormal.

3. The method of claim 1, wherein the null-ground voltage is obtained by detecting the voltage between the null wire and the ground wire via a differential voltage detection circuit.

4. A system for ground fault detection, comprising:
   at least one storage medium storing a set of instructions; and
   at least one processor in communication with the at least one storage medium, wherein when executing the set of instructions, the at least one processor is directed to cause the system to:
   obtain an input voltage by detecting a voltage between a live wire and a null wire, and a null-ground voltage by detecting a voltage between the null wire and a ground wire, respectively; wherein the input voltage is obtained by detecting the voltage between the live wire and the null wire via an isolation voltage detection circuit;
   determine whether the null-ground voltage is less than a voltage threshold;
   if the null-ground voltage is less than the voltage threshold, determine whether the null-ground voltage is less than a preset voltage;
   if the null-ground voltage is less than the preset voltage, determine that a grounding state is normal;
   if the null-ground voltage is greater than or equal to the preset voltage, determine that the grounding state is abnormal; and
   if the null-ground voltage is greater than or equal to the voltage threshold, determine that the live wire and the null wire are reversed;
   wherein the isolation voltage detection circuit includes a voltage transformer, one terminal of an input side of the voltage transformer connects to a live wire terminal through a first resistor, and the other terminal of the input side of the voltage transformer connect to a null wire terminal; two terminals of an output side of the voltage transformer respectively connects with two detection signal output terminals of the isolation voltage detection circuit through a second resistor and a third resistor, and a fourth resistor, a first diode and a second diode parallelly connect with the two terminals of the output side of the voltage transformer, while the first diode and the second diode are inverted in parallel; and the two detection signal output terminals of the isolation voltage detection circuit are respectively grounded through a first capacitor and a second capacitor.

5. The system of claim 4, wherein the at least one processor is further directed to cause the system to:
   in a case that the live wire and the null wire are reversed, determine whether a difference between the input voltage and the null-ground voltage is less than the preset voltage;
   if the difference between the input voltage and the null-ground voltage is less than the preset voltage, determine that the grounding state is normal; and
   if the difference between the input voltage and the null-ground voltage is greater than or equal to the preset voltage, determine that the grounding state is abnormal.

6. The system of claim 4, wherein the null-ground voltage is obtained by detecting the voltage between the null wire and the ground wire via a differential voltage detection circuit.

7. The system of claim 6, wherein the differential voltage detection circuit includes a differential amplifier, two input terminals of the differential amplifier respectively connect to a null wire terminal and a ground wire terminal, an output terminal of the differential amplifier serves as a detection signal output terminal of the differential voltage detection circuit.

8. A non-transitory computer readable medium comprising executable instructions that, wherein when executed by at least one processor, the executable instructions cause the at least one processor to effectuate a method comprising:

obtaining an input voltage by detecting a voltage between a live wire and a null wire, and a null-ground voltage by detecting a voltage between the null wire and a ground wire, respectively; wherein the input voltage is obtained by detecting the voltage between the live wire and the null wire via an isolation voltage detection circuit;

determining whether the null-ground voltage is less than a voltage threshold;

if the null-ground voltage is less than the voltage threshold, determining whether the null-ground voltage is less than a preset voltage;

if the null-ground voltage is less than the preset voltage, determining that a grounding state is normal;

if the null-ground voltage is greater than or equal to the preset voltage, determining that the grounding state is abnormal; and if the null-ground voltage is greater than or equal to the voltage threshold, determining that the live wire and the null wire are reversed;

wherein the isolation voltage detection circuit includes a voltage transformer, one terminal of an input side of the voltage transformer connects to a live wire terminal through a first resistor, and the other terminal of the input side of the voltage transformer connect to a null wire terminal; two terminals of an output side of the voltage transformer respectively connects with two detection signal output terminals of the isolation voltage detection circuit through a second resistor and a third resistor, and a fourth resistor, a first diode and a second diode parallelly connect with the two terminals of the output side of the voltage transformer, while the first diode and the second diode are inverted in parallel; and the two detection signal output terminals of the isolation voltage detection circuit are respectively grounded through a first capacitor and a second capacitor.

* * * * *